(12) United States Patent
Haig et al.

(10) Patent No.: US 9,679,631 B2
(45) Date of Patent: *Jun. 13, 2017

(54) SYSTEMS AND METHODS INVOLVING MULTI-BANK, DUAL- OR MULTI-PIPE SRAMS

(71) Applicant: GSI Technology, Inc., Sunnyvale, CA (US)

(72) Inventors: Robert Haig, Austin, TX (US); Patrick Chuang, Cupertino, CA (US); Chih Tseng, Fremont, CA (US); Mu-Hsiang Huang, San Jose, CA (US)

(73) Assignee: GSI Technology, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/951,160

(22) Filed: Nov. 24, 2015

(65) Prior Publication Data
US 2016/0189766 A1    Jun. 30, 2016

Related U.S. Application Data

(63) Continuation of application No. 14/170,497, filed on Jan. 31, 2014, now Pat. No. 9,196,324, which is a (Continued)

(51) Int. Cl.
*G11C 7/00* (2006.01)
*G11C 11/406* (2006.01)
(Continued)

(52) U.S. Cl.
CPC .... *G11C 11/40615* (2013.01); *G06F 13/1615* (2013.01); *G11C 7/1039* (2013.01);
(Continued)

(58) Field of Classification Search
CPC .. G11C 13/0069; G11C 11/419; G11C 7/1039
See application file for complete search history.

(56) References Cited

U.S. PATENT DOCUMENTS 5,563,834 A    10/1996   Longway et al.
5,768,559 A     6/1998   Iino et al.
(Continued)

FOREIGN PATENT DOCUMENTS

JP    2005-346922 A    12/2005

OTHER PUBLICATIONS

PCT/US12/50667, International Search Report dated Nov. 22, 2012 (4 pgs.).
(Continued)

*Primary Examiner* — Son Dinh
*Assistant Examiner* — Uyen B Tran
(74) *Attorney, Agent, or Firm* — DLA Piper LLP (US)

(57) ABSTRACT

Systems and methods are disclosed for increasing the performance of static random access memory (SRAM). Various systems herein, for example, may include or involve dual- or multi-pipe, multi-bank SRAMs, such as Quad-B2 SRAMs. In one illustrative implementation, there is provided an SRAM memory device including a memory array comprising a plurality of SRAM banks and pairs of separate and distinct pipes associated with each of the SRAM banks, wherein each pair of pipes may provide independent access to its associated SRAM bank.

37 Claims, 6 Drawing Sheets

- Example of 8-Banks and 2-Pipes (Pipes are labeled "U" and "V")

Related U.S. Application Data continuation of application No. PCT/US2012/050667, filed on Aug. 13, 2012, and a continuation of application No. 13/327,721, filed on Dec. 15, 2011, now Pat. No. 8,982,649.

(60) Provisional application No. 61/523,230, filed on Aug. 12, 2011.

(51) Int. Cl.
 *G11C 7/10* (2006.01)
 *G11C 11/419* (2006.01)
 *G06F 13/16* (2006.01)

(52) U.S. Cl.
 CPC .......... *G11C 7/1072* (2013.01); *G11C 11/419* (2013.01); *G11C 2207/229* (2013.01); *G11C 2207/2281* (2013.01)

(56) References Cited

U.S. PATENT DOCUMENTS

| | | | |
|---|---|---|---|
| 5,875,452 A * | 2/1999 | Katayama | G11C 7/1018 365/189.05 |
| 5,937,204 A | 8/1999 | Schinnerer | |
| 6,115,320 A | 9/2000 | Mick et al. | |
| 6,167,487 A | 12/2000 | Camacho | |
| 6,263,452 B1 | 7/2001 | Jewett et al. | |
| 6,366,524 B1 | 4/2002 | Abedifard | |
| 6,381,684 B1 | 4/2002 | Hronik et al. | |
| 6,418,077 B1 | 7/2002 | Naven | |
| 6,567,338 B1 | 5/2003 | Mick | |
| 6,732,247 B2 | 5/2004 | Berg et al. | |
| 6,938,142 B2 | 8/2005 | Pawlowski | |
| 7,180,816 B2 | 2/2007 | Park | |
| 7,246,215 B2 | 7/2007 | Lu et al. | |
| 7,340,577 B1 | 3/2008 | Van Dyke et al. | |
| 7,355,907 B2 | 4/2008 | Chen et al. | |
| 7,532,537 B2 * | 5/2009 | Solomon | G06F 12/0207 365/230.06 |
| 7,613,049 B2 * | 11/2009 | Hung | G11C 7/1045 365/189.02 |
| 7,630,230 B2 | 12/2009 | Wong | |
| 7,760,532 B2 | 7/2010 | Shirley et al. | |
| 7,916,554 B2 | 3/2011 | Pawlowski | |
| 8,190,808 B2 * | 5/2012 | Lai | G11C 7/1042 365/230.03 |
| 8,498,165 B2 * | 7/2013 | Hsue | G11C 7/1045 365/189.05 |
| 2002/0154565 A1 | 10/2002 | Noh et al. | |
| 2002/0168935 A1 | 11/2002 | Han | |
| 2004/0240301 A1 | 12/2004 | Rao | |
| 2004/0264286 A1 | 12/2004 | Ware et al. | |
| 2005/0026329 A1 | 2/2005 | Kim et al. | |
| 2005/0226079 A1 | 10/2005 | Zhu et al. | |
| 2006/0039227 A1 | 2/2006 | Lai et al. | |
| 2008/0010429 A1 | 1/2008 | Rao | |
| 2010/0177571 A1 | 7/2010 | Shori et al. | |
| 2011/0063898 A1 * | 3/2011 | Ong | G11C 7/18 365/158 |
| 2011/0153932 A1 | 6/2011 | Ware et al. | |
| 2013/0111282 A1 * | 5/2013 | Clark | G11C 29/28 714/718 |

OTHER PUBLICATIONS

PCT/US12/50667, Written Opinion dated Nov. 22, 2012 (10 pgs.).
PCT International Preliminary Report on Patentability of PCT/US2012/050667 dated Feb. 18, 2014 (11 pgs.).
EP 1282336.0 (EP2742506), Extended European Search Report dated Feb. 11, 2015 (7 pgs.).

* cited by examiner

Figure 1 – Example of 8-Banks and 2-Pipes (Pipes are labeled "U" and "V")

Figure 3 - Multi-Bank, Dual-Pipe Block Diagram: An m-deep Write Buffer per Write Pipe Figure 4 - Multi-Bank, Dual-Pipe Timing Diagram: A 2-deep Write Buffer per Write Pipe Figure 5 – Multi-Bank, Dual-Pipe Block Diagram: Single 2*m-deep Read Buffer for both Read Pipes Figure 6 - Multi-Bank, Dual-Pipe Block Diagram: Duplicate 2*m-deep Read Buffers per Read Pipe

SYSTEMS AND METHODS INVOLVING MULTI-BANK, DUAL- OR MULTI-PIPE SRAMS

CROSS REFERENCE TO RELATED APPLICATION INFORMATION

This is a continuation of application Ser. No. 14/170,497, filed Jan. 31, 2014, published as US2014/03004463A1, now U.S. Pat. No. 9,196,324 issued on Nov. 24, 2015, which is a continuation of PCT patent application No. PCT/US12/50667, published as WO21 013/025656, which claims benefit/priority of U.S. provisional application No. 61/523,230, filed Aug. 12, 2011, and U.S. non-provisional application Ser. No. 13/327,721, filed Dec. 15, 2011, now U.S. Pat. No. 8,982,649, all of which are incorporated herein by reference in entirety.

BACKGROUND

Field

Innovations herein relate generally to increasing the performance of static random access memory (SRAM), and, more specifically, to systems and methods including or involving dual- or multi-pipe multibank SRAMs.

Description of Related Information

By way of illustration, with regard to Quad burst-of-2 (Quad-B2) SRAMs for example, since two operations—a Read and a Write—are initiated per clock cycle, a single-bank SRAM must execute a Read and a Write operation, to any pair of random addresses, together (and sequentially) within a single clock cycle. Additional clock cycles may be used to pipeline Address & Write Data from SRAM input pins to the memory array, and to pipeline Read Data from the memory array to SRAM output pins, but the Read and Write memory accesses themselves must be executed together within a single clock cycle. Here, then, such operations must be executed sequentially, as simultaneous accesses would perforce have to be initiated to different banks. And single bank devices don't have multiple banks.

Further, in single-bank Quad-B2 SRAMs with optimized Read and Write pipelines, the maximum operating frequency (which equates to the maximum performance of the device) is therefore equal to one divided by the minimum amount of time "tRW" required to execute the R/W pair of operations. For example, if tRW=2 ns, then the maximum operating frequency is ½ ns=500 MHz.

Note that such single-bank Quad-B2 SRAMs typically utilize single Read and Write pipelines. In such SRAMs, utilizing multiple pipelines cannot improve the maximum operating frequency of the SRAM beyond that described above. That is, such single-bank Quad-B2 SRAMs are "single-pipe" as well.

As set forth below, one or more aspects of the present inventions may overcome these or other drawbacks and/or otherwise impart innovative features.

DESCRIPTION OF THE DRAWINGS

The accompanying drawings, which constitute a part of this specification, illustrate various implementations and aspects of the present invention and, together with the description, explain various features of the innovations herein. In the drawings.

DETAILED DESCRIPTION OF ILLUSTRATIVE IMPLEMENTATIONS

Reference will now be made in detail to the inventions herein, examples of which are illustrated in the accompanying drawings. The implementations set forth in the following description do not represent all embodiment consistent with the claimed inventions. Instead, they are merely some examples consistent with certain aspects related to the present inventions. Wherever possible, the same reference numbers will be used throughout the drawings to refer to the same or like parts.

As to definitions of some terms/expressions herein, "Single-Bank" means 1 distinct logical memory bank. "Multi-Bank" means ≥2 distinct logical memory banks. "Single-Pipe" means 1 distinct pipeline structure for both the Read Path and the Write Path. "Dual-Pipe" means 2 distinct pipeline structures for both the Read Path and the Write Path. "Multi-Pipe" means ≥☐2 distinct pipeline structures for both the Read Path and the Write Path.

Systems and methods herein may include and/or involve SRAM architecture of multi-bank, dual-pipe (or multi-pipe) device types. With regard to a "dial pipe" implementation, for example, an illustrative SRAM device may be configured such that each pair of Read and Write operations (which can be initiated each and every cycle) may alternate between two sets of Read and Write pipelines (i.e., for the dual pipe), and may be executed together over two cycles instead of within a single cycle (as in the single-bank SRAM). When the R/W pair of operations are executed over two cycles instead of one cycle, the maximum operating frequency of the SRAM doubles, to two divided by tRW. For example, if tRW=2 ns, then the maximum operating frequency is 2/2 ns=1 GHz. Here, because the R/W pair of operations are executed over two cycles, each new R/W pair of operations executed in cycles "n" and "n+1" will overlap, for one cycle, with the previous R/W pair of operations executed in cycles "n−1" and "n". In prior devices, such overlap issues typically restricted which banks could be accessed in cycle "n" (as a result of the new R/W pair of operations) to any banks not already being accessed in cycle "n" (as a result of the previous R/W pair of operations). Such bank restrictions, however, may be managed via features and aspects consistent with the present disclosure.

According to certain implementations, in connection with aspects of alternating R/W pair(s) of operations between two sets of Read and Write pipelines, lower cost/complexity Read and Write pipeline structures may be utilized in the multi-bank, dual-pipe SRAMs set forth herein, including Read and Write pipeline structures that help simplify the design. Further, in the present dual-pipe architecture(s), the propagation delay through the Read and Write pipelines, in units of "time", may match that of the single-pipe architecture. Consequently, the performance of the pipeline structures does not have to double even though the operating frequency has doubled.

Turning to some illustrative embodiments, multi-bank, dual-pipe architecture, to which a pair of Read and Write operations are initiated externally as often as each and every clock cycle, consistent with the innovations herein, may be implemented via Quad-B2 SRAMs. Here, as may be seen in part in FIG. 1, each SRAM "bank" 128 may comprise block of SRAM memory cells, organized as a matrix of X-rows and Y-columns, having all of the necessary memory cell access circuits, such as X-decoders, Y-decoders, Section-decoders, Read/Write controls, Read sense-amps, Write data input amps, etc. These devices may be configured such that each SRAM bank can be independently accessed, either substantially parallel to, or staggered overlap in time with, other SRAM banks via two separate and distinct pipes, in the dual-pipe case, and via "N" separate and distinct pipes, in the multi "N"-pipe case (see further below). Each SRAM "pipe" may comprise a Write Pipe and a Read Pipe. Further, each Write Pipe may comprise separate complete Write Address pre-decoder buses; separate Write Control signals; separate internal Write Data input buses, including separate m-deep Write Buffers for managing Write Data and Write Address propagation from input pins to memory array; and associated Write timing clock signals. Similarly, each Read Pipe may comprise separate complete Read Address pre-decoder buses; separate Read Control signals; separate internal Read Data output buses, including separate k-stage Output Pipelines for managing Read Data propagation from memory array to output pins; and associated Read timing clock signals.

Moreover, in some implementations, the structure of each Read Pipe and Write Pipe utilized in the dual-pipe and multi "n"-pipe cases can be the same as the structure of the Read Pipe and Write Pipe utilized in a single-bank, single-pipe Quad-B2 SRAM, such that the propagation delay through each Read Pipe and Write Pipe, in units of time, is the same as in the single-pipe case. In these implementations, the performance of the Read Pipe and Write Pipe structure does not have to double (in the dual-pipe case) or increase "n" times (in the multi "n"-pipe case) even though the maximum operating frequency doubles (in the dual-pipe case) or increases "n" times (in the multi "n"-pipe case) compared to the maximum operating frequency of the single-pipe case. Rather, in some implementations, the performance of the Read Pipe and Write Pipe may be the same in all cases, simplifying the design progression from single-pipe to dual-pipe to multi "n"-pipe.

It should be noted that, while many of the implementations discussed herein include or involve architecture of the Quad-B2 SRAM as a multi-bank dual-(2) pipe device in order to double the performance versus a Quad-B2 SRAM architected as single-bank device, other implementations herein relate to multi-bank multi- ("n", where n≥□2) pipes, in order to increase performance even further. Here, for example, 3 pipes can be used to triple performance, 4 pipes can be used to quadruple performance, etc. Further, in some implementations, the number of banks in the multi-bank structure must be greater than or equal to the number of pipes in the multi-pipe structure, so that each pipe can facilitate a memory access to a unique bank when the memory accesses associated with each pipe overlap. The maximum operating frequency of such a multi-bank, multi (n)-pipe Quad-B2 SRAM is equal to n/tRW.

Figure 1:
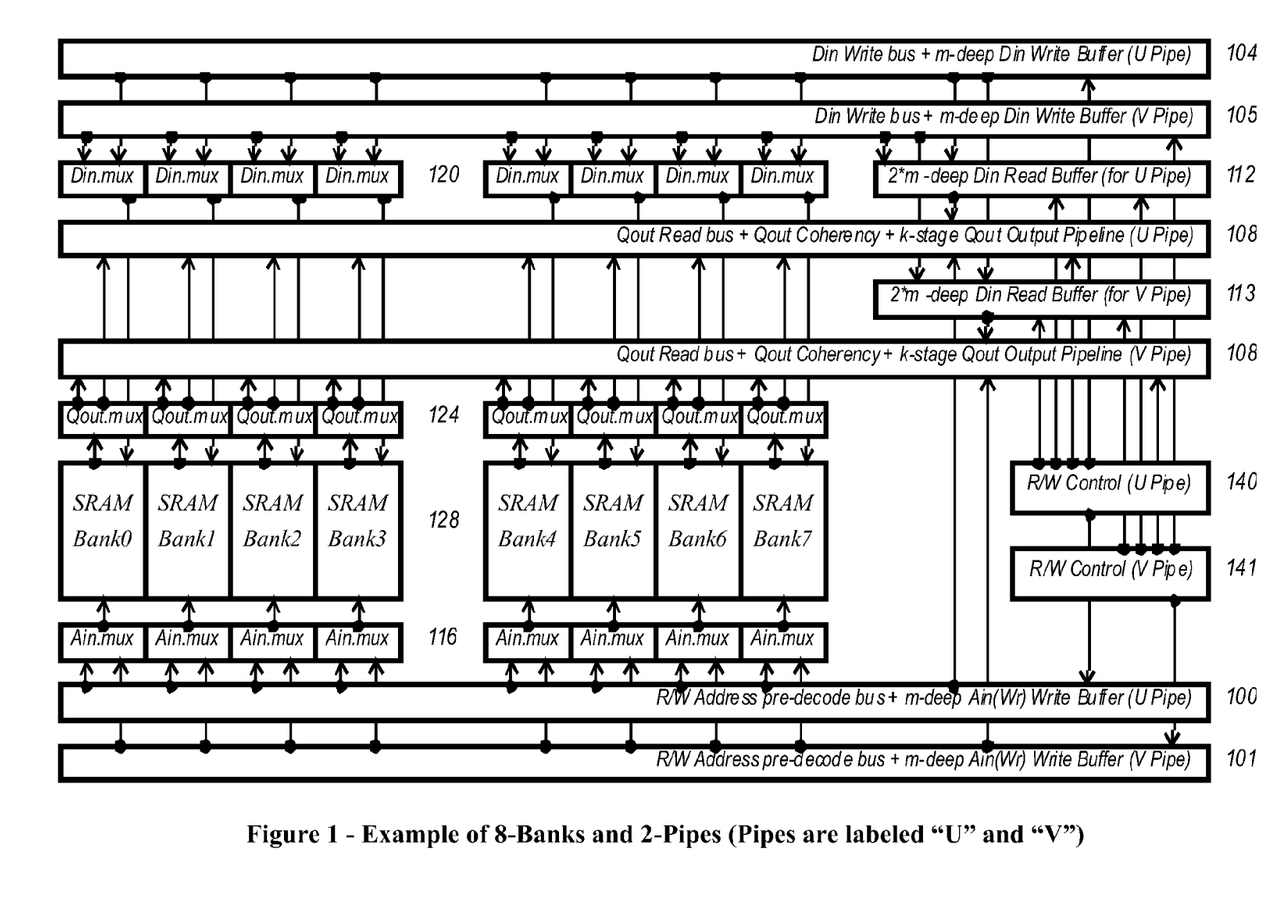
FIG. 1 is a diagram showing an illustrative SRAM configuration consistent with one or more aspects related to the innovations herein.

Turning back to the illustrative implementation shown in FIG. 1, each SRAM "pipe" may comprise (but is not necessarily limited to) separate complete Read/Write address pre-decoder buses (Xpd, Ypd, Zpd) 100 & 101, which may be configured to carry Read/Write control signals from control components such as Read/Write control circuits 140, 141, separate internal Write data input busses 104 & 105, including separate m-deep Write Buffers (for managing Write Data and Write Address propagation from input pins to memory array) [shown as part of 104 & 105 for purpose of this illustration], separate internal Read data output buses 108 & 109, including separate k-stage Output Pipelines (for managing Read Data propagation from memory array to output pins) 108 & 109, separate Read coherency logic 108 & 109, including separate 2*m-deep Read Buffers (for providing coherency Read Data, rather than using the Write Buffers themselves to provide such Read data) 112 & 113, and/or associated timing/clock circuitry and/or signals.

Further, in some implementations like that shown in FIG. 1, each SRAM pipe may be connected to all of the SRAM banks through multiplex control circuits 116 & 120 & 124, in such a way that each of "n" pipes implemented in the SRAM can be connected to any one of "t" banks implemented in the SRAM (t≥n) on a one-to-one basis. Further, a unique pipe-to-bank connection may be formed substantially parallel to, or staggered in time with, other such unique pipe-to-bank connections.

Additionally, while various components, such as control components/circuitry 140, 141, buffers, etc., are shown via or within the illustrative elements depicted in FIG. 1, SRAMs herein may utilize other configurations of such components, as well, including elements that are formed or distributed in different arrangements or configurations.

Notably, a requirement to certain implementations herein, is that each pipe must be connected to a unique SRAM bank at all times. This requirement may be managed as a function of the user controlling which banks are Read and Written at a particular time, such that no single bank is accessed more than once at any particular time. Such a "Bank Conflict Avoidance/Arbitration" requirement and associated features may allow for multiple simultaneous pipe-to-bank connections, either substantially parallel in time, or staggered overlap in time.

Features and functionality consistent with one or more aspects of the innovations described in this disclosure, and utilized to double performance over a single-bank Quad-B2 SRAM, may include or involve: (1) architecting an SRAM as a multi-bank, dual-pipe device; (2) as sequential Read operations are initiated, propagating Read Address to the memory array, and Read Data from the memory array to SRAM output pins, alternately between the two Read pipes; (3) as sequential Write operations are initiated, propagating Write Address and Write Data to the memory array alternately between the two Write pipes; and/or (4) executing each R/W pair of operations in the memory array within a fixed unit of time "tRW", independent of cycle time, where the Read is executed first and the Write is self-timed from the Read. Within each R/W pair, the Read and Write can be to the same memory bank, or to different banks.

Figure 2A:
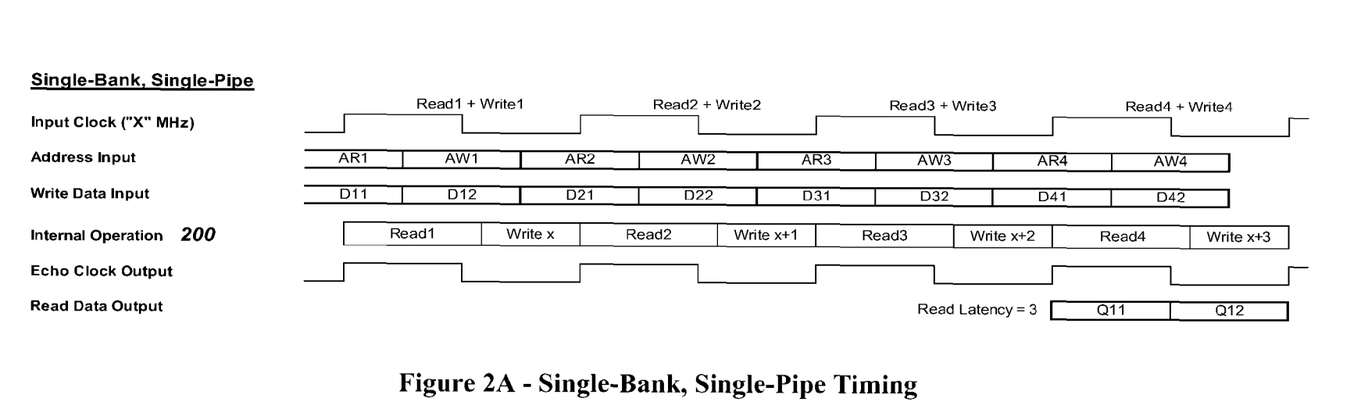
FIGS. 2A and 2B are representative timing diagrams showing operational timing features of a known single-bank, single-pipe memory (FIG. 2A) as compared to a multi-bank, dual-pipe memory (FIG. 2B) consistent with one or more aspects related to the innovations herein.
Figure 2B:
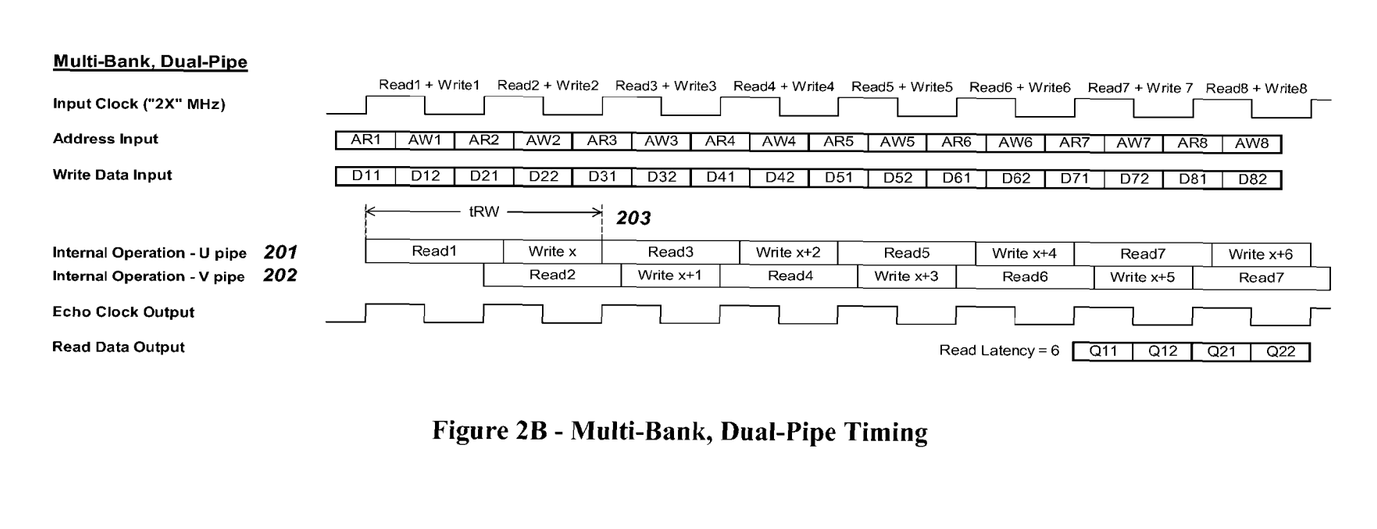

FIGS. 2A and 2B are representative timing diagrams showing operational timing features of a known single-bank, single-pipe memory (FIG. 2A) as compared to a multi-bank, dual-pipe memory (FIG. 2B) consistent with one or more aspects related to the innovations herein. FIGS. 2A-2B compare Multi-Bank, Dual-Pipe (MBDP) timing to Single-Bank, Single-Pipe (SBSP) timing. In the SBSP case, one Internal Operation sequence 200, associated with the single internal pipe, is illustrated. It depicts the R/W pair of operations executed in the memory array, as described in #4 above, at a particular tRW time period equal to 1 clock cycle, where the Read and Write operations comprising the pair propagate through one Read pipe and one Write pipe respectively. In the MBDP case, two Internal Operation sequences 201 & 202, associated with the two internal pipes (labeled "U pipe" and "V pipe"), are illustrated. The U pipe sequence 201 depicts the R/W pair of operations executed in the memory array, as described in #4 above, at a particular tRW time period equal to 2 clock cycles, where the Read and Write operations comprising the pair propagate through the Read U pipe and the Write U pipe respectively. Similarly, the V pipe sequence 202 depicts the R/W pair of operations executed in the memory array, as described in #4 above, at a particular tRW time period equal to 2 clock cycles, where the Read and Write operations comprising the pair propagate through the Read V pipe and the Write V pipe respectively.

Figure 3:
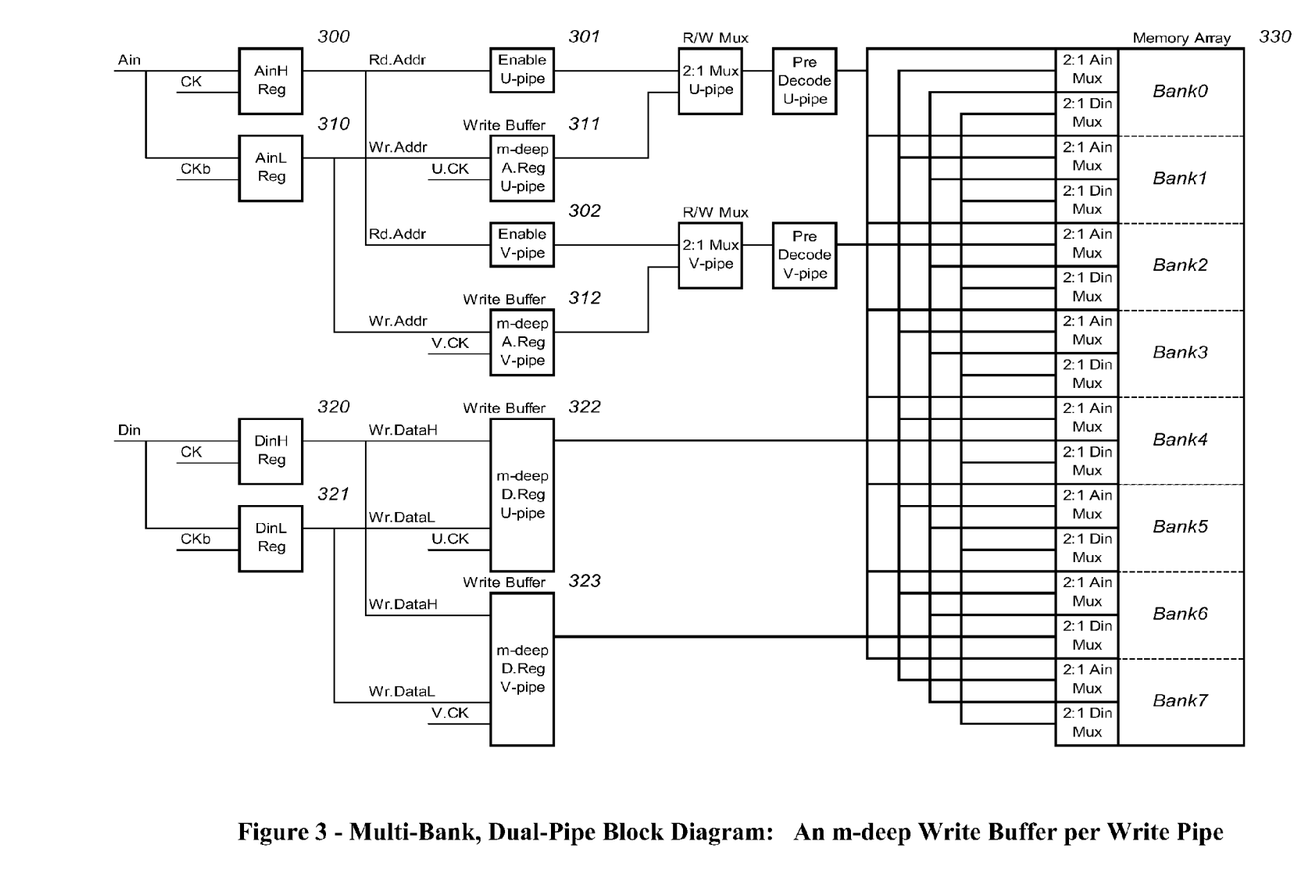
FIG. 3 is a diagram showing an illustrative SRAM configuration including an M-deep write buffer per write pipe, consistent with one or more aspects related to the innovations herein.

FIG. 3 is a diagram showing an illustrative SRAM configuration including an M-deep write buffer per write pipe, consistent with one or more aspects related to the innovations herein. Referring to FIG. 3, an illustrative block diagram, of the MBDP case, of the Read Address input path 300~302, Write Address input path 310~312, and Write Data input path 320~323 through the two internal Read and Write pipes (labeled "U pipe" and "V pipe") to an 8-bank memory array 330 is shown. Each Write pipe includes an m-deep Write Buffer 311~312 & 322~323 that stores the Write Address and Write Data associated with each externally-initiated Write operation for 2*m clock cycles before the Write operation is executed in the memory array.
Write Buffering Write Buffering may be required with various innovative systems and methods herein because within each R/W pair of operations, the Write is self-timed from the Read (as described in #4 above). And due to the nature of the dual-pipe architecture, an m-deep Write Buffer (m≥□1) 311~312 & 322~323 is utilized per Write pipe (the particular depth needed depends on many factors, and is beyond the scope of this disclosure). Consequently, the Write executed internally together with the Read initiated in cycle "a" (in FIG. 2 above, Write x is executed together with Read1, Write x+1 is executed together with Read2, etc.), comprising the R/W pair described in #4, is not the Write initiated in cycle "a" (which would be the case if there were no Write Buffering), but rather the Write initiated in cycle "a−2*m" (due to each Write pipe having an m-deep Write Buffer).

Note that Write Buffer depth affects which banks can be accessed when a Read is initiated. Specifically, when a Read is initiated in cycle "a", it must be to a different bank than the Write initiated in cycle "a−(1+2*m)", since the internal execution of those two operations will overlap.

Figure 4:
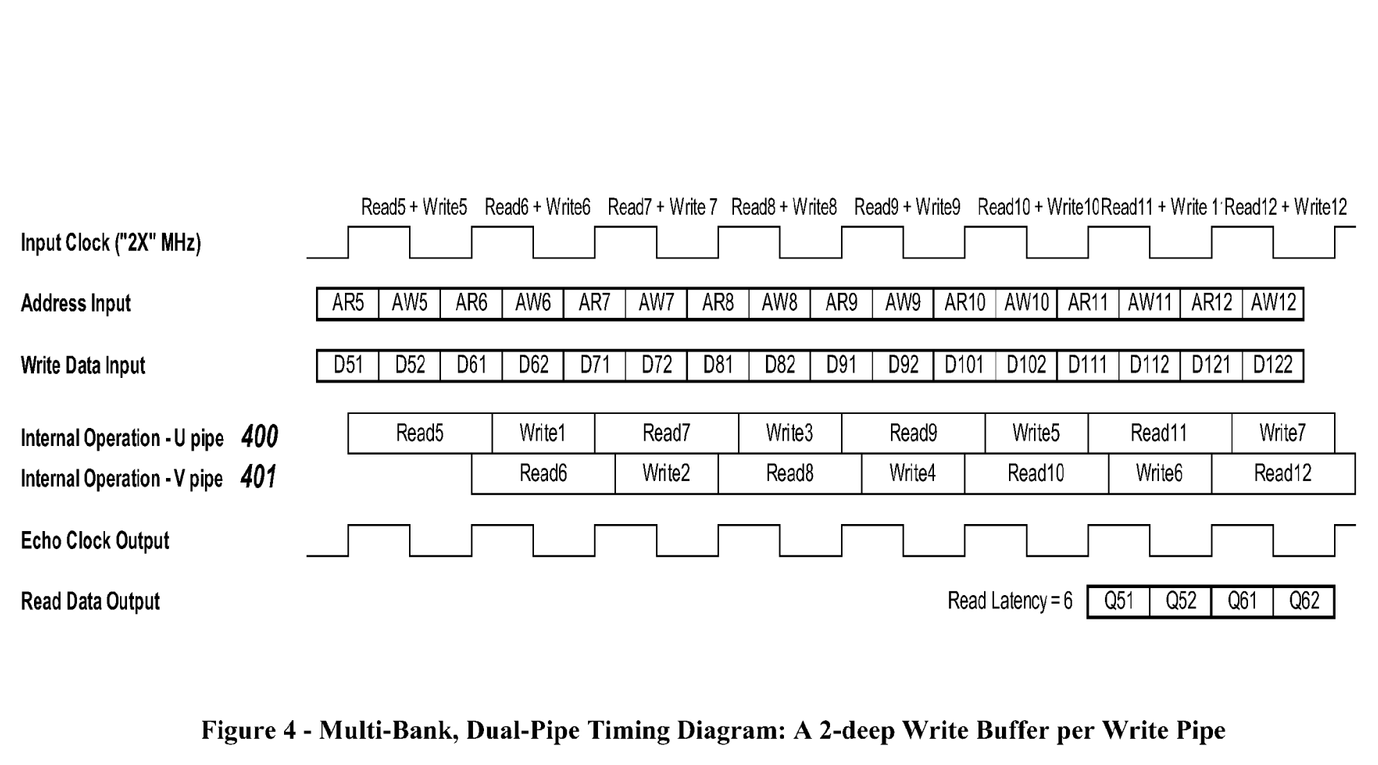
FIG. 4 is a representative timing diagram showing illustrative timing aspects of a dual-pipe SRAM with a 2-deep write buffer, consistent with one or more aspects related to the innovations herein.

FIG. 4 is a representative timing diagram showing illustrative timing aspects of a dual-pipe SRAM with a 2-deep write buffer, consistent with one or more aspects related to the innovations herein. Referring to FIG. 4, an illustrative MBMP timing associated with FIG. 2 with a 2-deep Write Buffer per Write pipe is shown. Consequently, each R/W pair of operations executed internally from the U pipe 400 and the V pipe 401 in cycles "a" and "a−1" comprises the Read operation from cycle "a" and the Write operation from cycle "a−2*2"="a−4".

In connection with certain of the exemplary implementations illustrated above, it should also be noted that Read in cycle "a" must be to a different bank than Write in cycle "a−(1+2*2)"="a−5", because internally the two operations overlap. Also, according to one or more of the illustrative implementations shown, Read in cycle "a" must be to a different bank than Read in cycle "a−1", because internally the two operations overlap (slightly).
Maintaining Coherency Quad-B2 SRAMs are required to be coherent; that is, Read operations to a particular address must always return the most recently written data to that address. Coherency is automatically maintained when no Write Buffers are utilized, because in that case Read and Write operations are executed internally in the same order in which they are initiated externally. However, in implementations herein that utilize Write Buffers, coherency may be maintaining via requiring that Read data be fetched from the Write Buffers, rather than from the memory array, when a Read operation is initiated to the same address as that of a previous Write operation that has not yet been executed in the memory array.

Maintaining coherency in a dual-pipe architecture is further complicated by the fact that regardless from which Read pipe a Read operation is executed, the Read address must be checked against all of the Write operations that have not yet been executed in the memory array; that is, it must be checked against the Write addresses stored in the Write Buffers in both Write pipes.

Embodiments herein may also include innovative features associated with Read pipe design and timing requirements, for example, when each Write pipe utilizes an m-deep Write Buffer, a separate and distinct 2*m-deep Read Buffer, which duplicates the contents of the m-deep Write Buffers used in both Write pipes, may be implemented. Such implementation may take various forms such as: a single 2*m-deep Read Buffer 501 (see FIG. 5), for use by both Read pipes; or duplicate 2*m-deep Read Buffers 601 & 602 (see FIG. 6), one per Read pipe, if it helps optimize the efficiency of the Read pipes.

Further, Read Buffer contents may be generated during Write propagation through each Write pipe, and are checked (and read) by the individual coherency logic associated with each Read pipe. In this way, each Read pipe can check for the existence of, and read back if it does exist, any Write Data that has not yet propagated through the Write Buffer of either Write pipe, regardless in which Write pipe the Write Data resides.

Figure 5:
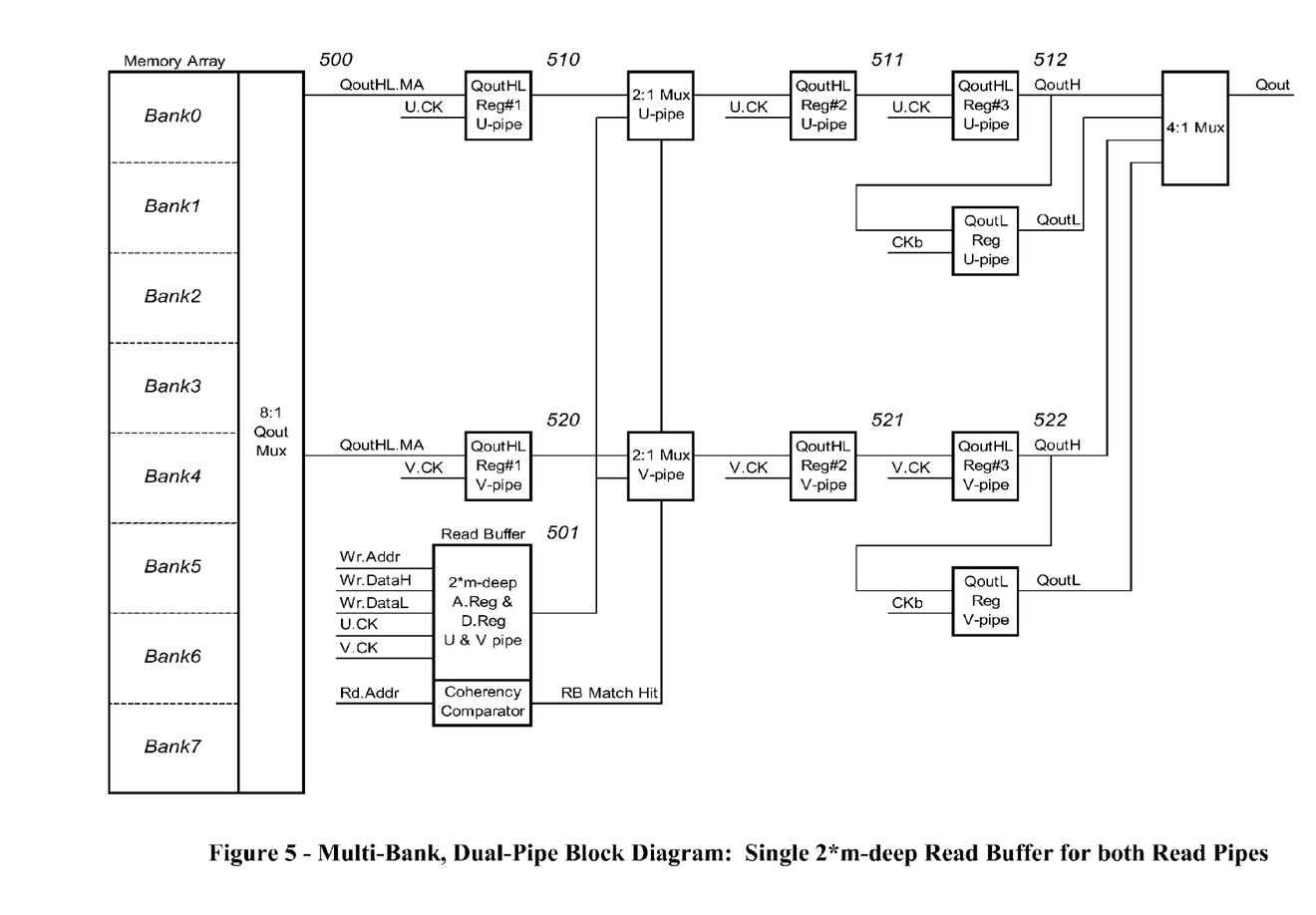
FIG. 5 is a diagram showing an illustrative dual-pipe SRAM configuration including a single 2*M-deep read buffer for both read pipes, consistent with one or more aspects related to the innovations herein.

FIG. 5 is an illustrative block diagram, of the MBDP case, of the Read Data output path from an 8-bank memory array 500 through the two internal Read pipes (labeled "U pipe" and "V pipe"). Referring to FIG. 5, each Read pipe includes a 3-stage Output Pipeline 510~512 & 520~522 that is used to propagate Read Data to the output pins. Additionally, a single 2*m-deep Read Buffer 501 is used by both Read pipes for maintaining coherency.

Further, with regard to FIG. 5, the representative implementation(s) depicted show the Read Buffer data being MUXed into the Read path, with Read data from the memory array 500, after the 1$^{st}$ stage 510 & 520 of a 3-stage Output Pipeline 510~512 & 520~522 per Read pipe. This is for illustrative purposes only. In other implementations consistent with the innovations herein, for example, the Read Buffer data can be MUXed into the Read path after any stage of a k-stage Output Pipeline.

Figure 6:
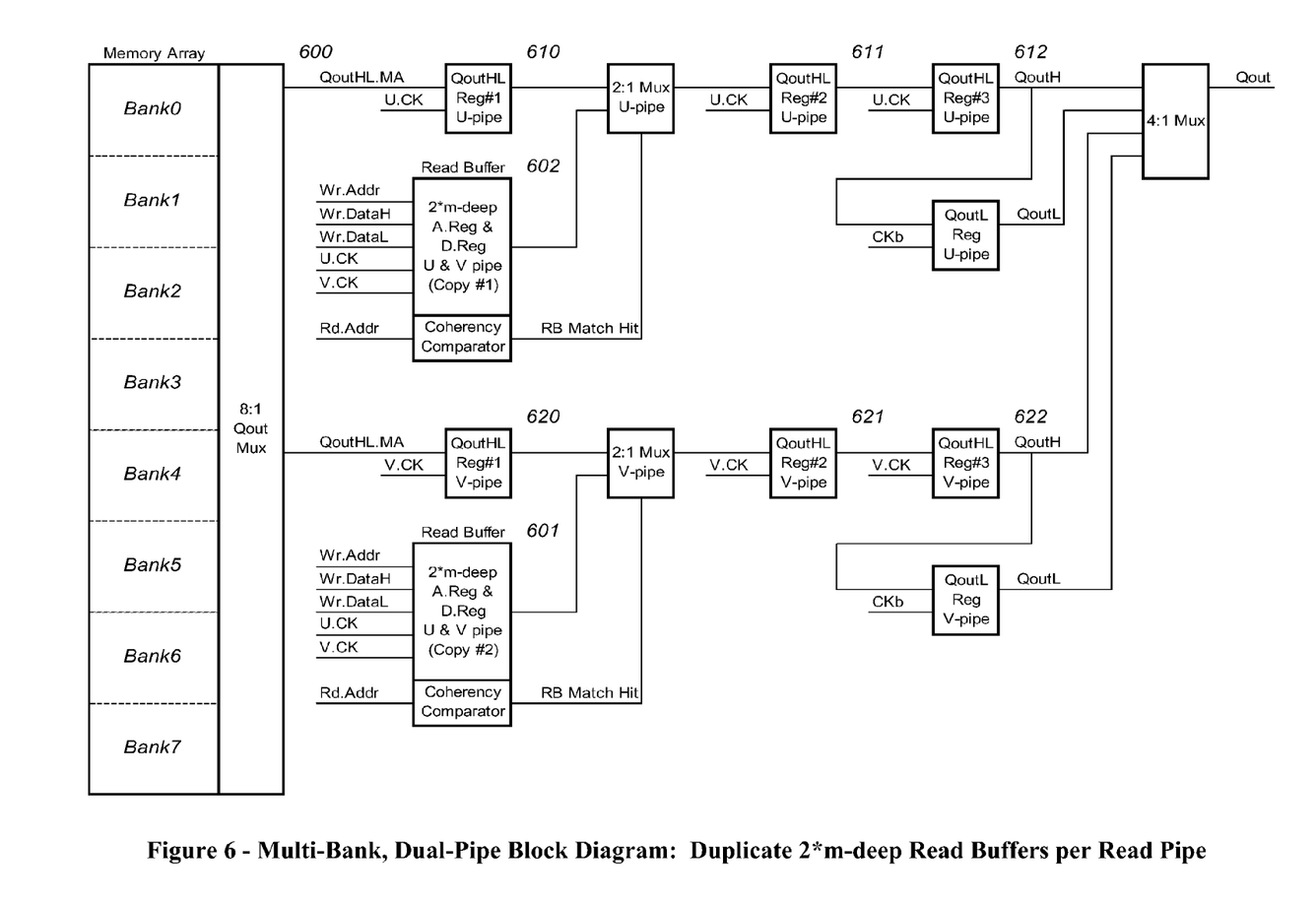
FIG. 6 is a diagram showing an illustrative dual-pipe SRAM configuration including duplicate 2*M-deep read buffers per read pipe, consistent with one or more aspects related to the innovations herein.

FIG. 6 below is an illustrative block diagram, of the MBDP case, of the Read Data output path from an 8-bank memory array 600 through the two internal Read pipes (labeled "U pipe" and "V pipe"). In the exemplary implementation shown, each Read pipe includes a 3-stage Output Pipeline 610~612 & 620~622 that is used to propagate Read Data to the output pins. Additionally, one 2*m-deep Read Buffer 602 is used exclusively by the U Read pipe for maintaining coherency, and one 2*m-deep Read Buffer 601 is used exclusively by the V Read pipe for maintaining coherency.

Further, with regard to FIG. 6, the representative implementation(s) depicted show the Read Buffer data being MUXed into the Read path, with Read data from the memory array 600, after the $1^{st}$ stage 610 & 620 of a 3-stage Output Pipeline 610~612 & 620~622 per Read pipe. This is for illustrative purposes only. In other implementations consistent with the innovations herein, for example, the Read Buffer data can be MUXed into the Read path after any stage of a k-stage Output Pipeline.

Additionally, the innovations herein may be achieved via implementations with differing or disparate components, i.e., beyond the specific circuits or circuitry set forth above. With regard to such other components (e.g., circuitry, computing/processing components, etc.) and/or computer-readable media associated with or embodying the present disclosure, for example, aspects of the innovations herein may be implemented consistent with numerous general or special purpose circuits, computing systems or configurations. Various exemplary circuits, computing systems, environments, and/or configurations that may be suitable for use with the innovations herein may include, but are not limited to, various power- or memory-related circuitry, such as that within personal computers, servers or server computing devices such as routing/connectivity components, hand-held or laptop devices, multiprocessor systems, microprocessor-based systems, set top boxes, smart phones, consumer electronic devices, network PCs, other existing computer platforms, distributed computing environments that include one or more of the above systems or devices, etc.

In some instances, aspects of the innovations herein may be achieved via logic and/or logic instructions including program modules, executed in association with the circuitry, for example. In general, program modules may include routines, programs, objects, components, data structures, etc. that perform particular tasks or implement particular control, delay or instructions. The inventions may also be practiced in the context of distributed circuit settings where circuitry is connected via communication buses, circuitry or links. In distributed settings, control/instructions may involve one or both local and remote computer storage media including memory storage devices.

Innovative circuitry and components herein may also include and/or utilize one or more type of computer readable media. Computer readable media can be any available media that is resident on, associable with, or can be accessed by such circuits and/or computing components. By way of example, and not limitation, such computer readable media may include or involve computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic tape, magnetic disk storage or other magnetic storage devices, or any other medium which can be used to store the desired information and can accessed by computing component. Communication media may comprise computer readable instructions, data structures, program modules or other data embodying the functionality herein. Further, communication media may include wired media such as a wired network or direct-wired connection, and wireless media such as acoustic, RF, infrared and other wireless media. Combinations of the any of the above are also included within the scope of computer readable media.

In the present description, the terms component, module, device, etc. may refer to any type of logical or functional circuits, blocks and/or processes that may be implemented in a variety of ways. For example, the functions of various circuits and/or blocks can be combined with one another into any other number of modules. Each module may even be implemented as a software program stored on a tangible memory (e.g., random access memory, read only memory, CD-ROM memory, hard disk drive) to be read by a central processing unit to implement the functions of the innovations herein. Or, the modules can comprise programming instructions transmitted to a general purpose computer or to processing/graphics hardware. Also, the modules can be implemented as other hardware logic circuitry implementing the functions encompassed by the innovations herein. Finally, the modules can be implemented using special purpose instructions (SIMD instructions), field programmable logic arrays or any mix thereof which provides the desired level performance and cost.

As disclosed herein, implementations and features consistent with the present inventions may be implemented through computer-hardware, software and/or firmware. For example, the systems and methods disclosed herein may be embodied in various forms including, for example, in association with memory of data processors, such as in computers that also include a database, digital electronic circuitry, firmware, software, or in combinations of them. Further, while some of the disclosed implementations describe components such as circuits, systems and methods consistent with the innovations herein may be implemented with any combination of hardware, software and/or firmware. Moreover, the above-noted features and other aspects and principles of the innovations herein may be implemented in various environments. Such environments and related applications may be specially constructed for performing the various processes and operations according to the invention or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the invention, or it may be more convenient to construct a specialized apparatus or system to perform the required methods and techniques.

Aspects of the method and system described herein, such as the logic, may be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various circuits, logic and/or functions disclosed herein may be enabled using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media) and other mechanisms that may be used to transfer such formatted data and/or instructions through wireless, optical, or wired signaling media or any combination thereof. Examples of transfers of such formatted data and/or instructions include, but are not limited to, transfers (uploads, downloads, e-mail, etc.) over the Internet and/or other computer networks via one or more data transfer protocols (e.g., HTTP, FTP, SMTP, and so on).

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

In addition to the above SRAMs and SRAM architecture, the present inventions also include, inter alia, methods of fabricating SRAM devices consistent with the features and/or functionality herein, products (such as SRAMs or products embodying SRAMs), and products produced via processes of fabricating such devices. By way of example and not limitation, methods of such fabrication may include known SRAM manufacturing processes in CMOS technologies involving aspects such as p-mos and n-mos transistor formation, multiple metallization layers and/or local interconnects, among others. A variety of exemplary/staple processes here, for example, being set forth in the backgrounds/disclosures of U.S. Pat. Nos. 4,794,561, 5,624,863, 5,994,178, 6,001,674, 6,117,754, 6,127,706, 6,417,549, 6,894,356, and 7,910,427 as well as U.S. patent application publication No. US2007/0287239A1, which are incorporated herein by reference.

Although certain implementations of the innovations herein have been specifically described herein, it will be apparent to those skilled in the art to which the inventions pertains that variations and modifications of the various implementations shown and described herein may be made without departing from the spirit and scope of the disclosure. Accordingly, it is intended that the inventions be limited only to the extent required by the appended claims and the applicable rules of law.

The invention claimed is:

1. An SRAM memory device comprising:
a memory array comprising a plurality of SRAM banks, wherein each SRAM bank includes a block of SRAM memory cells organized as a matrix of X-rows and Y-columns and memory cell access circuitry;
a pair of separate and distinct pipes associated with each of the SRAM banks, each pair of pipes providing independent access to its associated SRAM bank, wherein each pair of pipes includes:
a write pipe configured with a separate complete write address pre-decoder bus, separate write control signals, a separate internal write data input bus, a separate m-deep write buffer that manages write data and write address propagation from input pins to memory array, and a write timing clock signal circuit; and
a read pipe configured with a separate complete read address pre-decoder bus, separate read control signals, a separate internal read data output bus, a separate k-stage output pipeline that manages read data propagation from memory to output pins, and associated read timing clock signals; and
wherein the device is configured such that each pair of pipes provides the access to its associated SRAM bank substantially parallel to, or staggered overlap in time, with access to other SRAM banks via other pairs of pipes.

2. The device of claim 1 further configured to enable a pair of Read and Write operations being initiated externally as often as each and every clock cycle.

3. The device of claim 1 wherein the structure of each Read Pipe and Write Pipe utilized is the same as the structure of the Read Pipe and Write Pipe utilized in a single-bank, single-pipe Quad-B2 SRAM, such that propagation delay through each Read Pipe and Write Pipe, in units of time, is equivalent to a comparable single-pipe configuration.

4. The device of claim 1 further configured such that performance of the Read Pipe and Write Pipe structure does not have to double even though the maximum operating frequency doubles compared to the maximum operating frequency of the single-pipe case, instead the performance of the Read Pipe and Write Pipe is equivalent in all cases.

5. The device of claim 1 wherein the memory cell access circuitry comprises one or more X-decoders, one or more Y-decoders, one or more section-decoders, read/write control circuitry, one or more read sense-amps, and/or one or more write data input amps.

6. The device of claim 1 wherein the device includes or is a Quad-B2 SRAM.

7. An SRAM memory device comprising:
a memory array comprising a plurality of SRAM banks, wherein each SRAM bank includes a block of SRAM memory cells organized as a matrix of X-rows and Y-columns and memory cell access circuitry;
a set of N separate and distinct pipes associated with each of the SRAM banks, each set of pipes providing independent access to its associated SRAM bank, wherein each set of pipes includes:

a write pipe configured with a separate complete write address pre-decoder bus, separate write control signals, a separate internal write data input bus, a separate m-deep write buffer that manages write data and write address propagation from input pins to memory array, and a write timing clock signal circuit; and a read pipe configured with a separate complete read address pre-decoder bus, separate read control signals, a separate internal read data output bus, a separate k-stage output pipeline that manages read data propagation from memory to output pins, and associated read timing clock signals; and wherein the device is configured such that each set of pipes provides the access to its associated SRAM bank substantially parallel to, or staggered overlap in time, with access to other SRAM banks via other sets of pipes.

8. The device of claim 7 further configured to enable a pair of Read and Write operations being initiated externally as often as each and every clock cycle.

9. The device of claim 7 wherein the structure of each Read Pipe and Write Pipe utilized is the same as the structure of the Read Pipe and Write Pipe utilized in a single-bank, single-pipe Quad-B2 SRAM, such that propagation delay through each Read Pipe and Write Pipe, in units of time, is equivalent to a comparable single-pipe configuration.

10. The device of claim 7 further configured such that performance of the Read Pipe and Write Pipe structure does not have to increase N times even though the maximum operating frequency may increase N times compared to the maximum operating frequency of the single-pipe case, instead the performance of the Read Pipe and Write Pipe is equivalent in all cases.

11. The device of claim 7 wherein the memory cell access circuitry comprises one or more X-decoders, one or more Y-decoders, one or more section-decoders, read/write control circuitry, one or more read sense-amps, and/or one or more write data input amps.

12. The device of claim 7 wherein the device includes or is a Quad-B2 SRAM.

13. An SRAM memory device comprising:
a memory array comprising a plurality of T SRAM banks, wherein each SRAM bank includes a block of SRAM memory cells organized as a matrix of X-rows and Y-columns and memory cell access circuitry;
a pair of separate and distinct pipes associated with each of the SRAM banks, each pair of pipes providing independent access to its associated SRAM bank, wherein each pair of pipes includes a write pipe and a read pipe; and
one or more multiplex control circuits coupled to the write pipes and the read pipes, the one or more multiplex control circuits being interconnected with the read pipes, the write pipes and the SRAM banks or all of the SRAM banks such that each read pipe and each write pipe is connected to any one of the T SRAM banks (where t>=2) on a one-to-one basis;
wherein the device is configured such that each pair of pipes provides the access to its associated SRAM bank substantially parallel to, or staggered overlap in time, with access to other SRAM banks via other pairs of pipes.

14. The device of claim 13 wherein the pairs of pipes, the multiplex control circuits and the SRAM banks are arranged/formed/interconnected to provide a unique pipe-to-bank connection between each pipe and bank pairing, such that each of the unique pipe to bank connections is configured to be connected parallel to, substantially parallel to, or staggered in time, with other unique pipe-to-bank connections.

15. The device of claim 13 wherein the device is or includes a Quad-B2 SRAM.

16. An SRAM memory device comprising:
a memory array comprising a plurality of T SRAM banks, wherein each SRAM bank includes a block of SRAM memory cells organized as a matrix of X-rows and Y-columns and memory cell access circuitry;
a set of N separate and distinct pipes associated with each of the SRAM banks, each set of pipes providing independent access to its associated SRAM bank, wherein each set of pipes includes a write pipe and a read pipe; and
one or more multiplex control circuits coupled to the write pipes and the read pipes, the one or more multiplex control circuits being interconnected/multiplexed with the read pipes, the write pipes and the SRAM banks or all of the SRAM banks such that each of the N pipes is connectable, via configuration of the one or more multiplex circuits, to any one of the T SRAM banks (where T>=N) on a one-to-one basis.

17. The device of claim 16 wherein the sets of pipes, the multiplex control circuits and the SRAM banks are configured/arranged/formed/interconnected to provide a unique pipe-to-bank connection between each pipe and bank pairing, such that each of the unique pipe to bank connections is configurable to be electrically connected parallel to, substantially parallel to, or staggered in time with, other unique pipe-to-bank connections.

18. The device of claim 16 wherein the device is or includes a Quad-B2 SRAM.

19. The device of claim 16 wherein the device is configured such that each pair of pipes provides the access to its associated SRAM bank substantially parallel to, or staggered overlap in time, with access to other SRAM banks via other pairs of pipes.

20. A SRAM memory device comprising:
a memory array comprising a plurality of T SRAM banks, wherein each SRAM bank includes a block of SRAM memory cells organized as a matrix of X-rows and Y-columns and memory cell access circuitry;
a pair of separate and distinct pipes associated with each of the SRAM banks, each pair of pipes providing independent access to its associated SRAM bank, wherein each pair of pipes includes a write pipe and a read pipe; and
one or more multiplex control circuits coupled to the write pipes and the read pipes, the one or more multiplex control circuits being interconnected with the read pipes, the write pipes and the SRAM banks or all of the SRAM banks such that each read pipe and each write pipe is connected to any one of the T SRAM banks (where T>=2) on a one-to-one basis;
control circuitry or a control component configured for:
executing a read operation and a write operation sequentially in a fixed unit of time spanning two cycles of the SRAM device operation, as sequential read operations are initiated, propagating/transmitting (i) read address values from input pins to the memory array and (ii) read data values from the memory array to output pins in an alternating manner between 2 read pipes; and
as sequential write operations are initiated, propagating/transmitting (i) write address values and write data values from input pins to the memory array in an alternating manner between 2 write pipes;

wherein each read/write pair of operations are executed in the memory array within a fixed unit of time, independent of cycle time; and wherein, as a function of executing the read/write operations sequentially in a fixed unit of time that spans 2 cycles as compared to spanning one cycle in single-pipe operation, a maximum operating frequency of the SRAM device is doubled as compared to a single-pipe SRAM configuration.

21. The device of claim 20 wherein the read is executed first and the write is self-timed from the read.

22. The device of claim 20 wherein, for each read/write pair of operations, the read and write signals/instructions/operations can be transmitted to different memory banks or to a same memory bank.

23. The device of claim 20 wherein, as a result of the inclusion of an m-deep write buffer in each write pipe, a write operation executed in the memory array together with, and immediately after, an associated read operation, corresponds to a write operation that was initiated in cycle "a−2*m", not a write operation that was initiated in cycle "a" together with the Read operation.

24. A SRAM memory device comprising:
a memory array comprising a plurality of T SRAM banks, wherein each SRAM bank includes a block of SRAM memory cells organized as a matrix of X-rows and Y-columns and memory cell access circuitry;
a set of N separate and distinct pipes associated with each of the SRAM banks, each set of pipes providing independent access to its associated SRAM bank, wherein each pair of pipes includes a write pipe and a read pipe; and
one or more multiplex control circuits coupled to the write pipes and the read pipes, the one or more multiplex control circuits being interconnected with the read pipes, the write pipes and the SRAM banks or all of the SRAM banks such that each read pipe and each write pipe is connected to any one of the T SRAM banks (where T>=N) on a one-to-one basis;
control circuitry or a control component configured for:
executing a read operation and a write operation sequentially in a fixed unit of time spanning two cycles of the SRAM device operation;
as sequential read operations are initiated, propagating/transmitting (i) read address values from input pins to the memory array and (ii) read data values from the memory array to output pins in an alternating manner between 2 read pipes; and
as sequential write operations are initiated, propagating/transmitting (i) write address values and write data values from input pins to the memory array in an alternating manner between 2 write pipes;
wherein each read/write pair of operations are executed in the memory array within a fixed unit of time, independent of cycle time; and wherein, as a function of executing the read/write operations sequentially in a fixed unit of time that spans 2 cycles as compared to spanning one cycle in single-pipe operation, a maximum operating frequency of the SRAM device is multiplied by N as compared to a single-pipe SRAM configuration.

25. The device of claim 24 wherein the read is executed first and the write is self-timed from the read.

26. The device of claim 24 wherein, for each read/write pair of operations, the read and write signals/instructions/operations can be transmitted to different memory banks or to a same memory bank.

27. The device of claim 24 wherein, as a result of the inclusion of an m-deep write buffer in each write pipe, a write operation executed in the memory array together with, and immediately after, an associated read operation, corresponds to a write operation that was initiated in cycle "a−2*m", not a write operation that was initiated in cycle "a" together with the read operation.

28. A SRAM memory device comprising:
a memory array comprising a plurality of 'T' SRAM banks, wherein each SRAM bank includes a block of SRAM memory cells organized as a matrix of X-rows and Y-columns and memory cell access circuitry;
a pair of separate and distinct pipes associated with each of the SRAM banks, each pair of pipes providing independent access to its associated SRAM bank, wherein each pair of pipes comprises a write pipe that includes an m-deep write buffer and a read pipe that includes a k-stage output pipeline; and
read buffer circuitry that duplicates contents of all of the m-deep write buffers, wherein the read buffer circuitry is configured for utilization by the read pipes to provide coherent read data in response to read operations initiated to memory addresses that match one or more of those residing in one of the m-deep write buffers;
wherein the read buffer circuitry comprises a 2*m-deep read buffer configured to be utilized by both read pipes to provide the coherent read data.

29. The device of claim 28 wherein the device includes or is a Quad-B2 SRAM.

30. The device of claim 28 wherein the device is configured such that read buffer contents are generated during write propagation through each write pipe.

31. The device of claim 30 wherein the device is further configured such that read buffer contents are checked and read by the individual coherency logic associated with each read pipe during read operations.

32. The device of claim 31 wherein, as a function of device and read buffer configuration, each read pipe is enabled to check for the existence of, and read back if it does exist, any write data that still resides in a write buffer in one of the write pipes.

33. The device of claim 28 wherein the device is configured such that, during a read operation in which read data is provided from a read buffer instead of the memory array, the read data from the read buffer can be multiplexed into the read path of the selected read pipe, along with read data from the memory array, after any stage of the k-stage output pipeline.

34. A SRAM memory device comprising:
a memory array comprising a plurality of T SRAM banks, wherein each SRAM bank includes a block of SRAM memory cells organized as a matrix of X-rows and Y-columns and memory cell access circuitry;
a set of N separate and distinct pipes associated with each of the SRAM banks, each set of pipes providing independent access to its associated SRAM bank, wherein each set of pipes comprises a write pipe that includes an m-deep write buffer and a read pipe that includes a k-stage output pipeline; and
read buffer circuitry that duplicates contents of all of the m-deep write buffers, wherein the read buffer circuitry is configured for utilization by the read pipes to provide coherent read data in response to read operations initiated to memory addresses that match one or more of those residing in one of the m-deep write buffers;

wherein the read buffer circuitry comprises a N*m-deep read buffer configured to be utilized by all read pipes to provide the coherent read data.

35. A SRAM memory device comprising:
a memory array comprising a plurality of T SRAM banks, wherein each SRAM bank includes a block of SRAM memory cells organized as a matrix of X-rows and Y-columns and memory cell access circuitry;
a pair of separate and distinct pipes associated with each of the SRAM banks, each pair of pipes providing independent access to its associated SRAM bank, wherein each pair of pipes comprises a write pipe that includes an m-deep write buffer and a read pipe that includes a k-stage output pipeline; and
read buffer circuitry that duplicates contents of all of the m-deep write buffers, wherein the read buffer circuitry is configured for utilization by the read pipes to provide coherent read data in response to read operations initiated to memory addresses that match one or more of those residing in one of the m-deep write buffers;
wherein the read buffer circuitry comprises a 2*m-deep read buffers, each read buffer being configured for dedication to, and utilization solely by, a particular/assigned read pipe to provide the coherent read data.

36. The device of claim 35 wherein the read buffers are duplicates of each other.

37. A SRAM memory device comprising:
a memory array comprising a plurality of T SRAM banks, wherein each SRAM bank includes a block of SRAM memory cells organized as a matrix of X-rows and Y-columns and memory cell access circuitry;
a set of N separate and distinct pipes associated with each of the SRAM banks, each set of pipes providing independent access to its associated SRAM bank, wherein each set of pipes comprises a write pipe that includes an m-deep write buffer and a read pipe that includes a k-stage output pipeline; and
read buffer circuitry that duplicates contents of all of the m-deep write buffers, wherein the read buffer circuitry is configured for utilization by the read pipes to provide coherent read data in response to read operations initiated to memory addresses that match one or more of those residing in one of the m-deep write buffers;
wherein the read buffer circuitry comprises N*m-deep read buffers, each read buffer being configured for dedication to, and utilization solely by, a particular/assigned read pipe to provide the coherent read data.

* * * * *